(12) United States Patent
Camarota et al.

(10) Patent No.: US 7,242,218 B2
(45) Date of Patent: Jul. 10, 2007

(54) TECHNIQUES FOR COMBINING VOLATILE AND NON-VOLATILE PROGRAMMABLE LOGIC ON AN INTEGRATED CIRCUIT

(75) Inventors: Rafael Camarota, Sunnyvale, CA (US); Irfan Rahim, San Jose, CA (US); Boon Jin Ang, Penang (MY); Thow Pang Chong, Johor (MY)

(73) Assignee: Altera Corporation, San Jose, CA (US)

( * ) Notice: Subject to any disclaimer, the term of this patent is extended or adjusted under 35 U.S.C. 154(b) by 171 days.

(21) Appl. No.: 11/003,586

(22) Filed: Dec. 2, 2004

(65) Prior Publication Data

US 2006/0119384 A1 Jun. 8, 2006

(51) Int. Cl.
  H03K 19/173 (2006.01)
  H03K 19/177 (2006.01)
  G06F 7/38 (2006.01)
  H01L 25/00 (2006.01)

(52) U.S. Cl. .......................... 326/41; 326/37; 326/38; 326/39; 326/40; 326/47; 716/16; 710/100; 710/104; 710/131

(58) Field of Classification Search ............ 326/37–41, 326/47
See application file for complete search history.

(56) References Cited

U.S. PATENT DOCUMENTS

| | | | |
|---|---|---|---|
| 5,825,202 A | | 10/1998 | Tavana et al. |
| 5,874,834 A | | 2/1999 | New |
| 6,091,262 A | | 7/2000 | New |
| 6,094,065 A | | 7/2000 | Tavana et al. |
| 6,102,963 A | * | 8/2000 | Agrawal ...................... 716/17 |
| 6,145,020 A | * | 11/2000 | Barnett .......................... 710/8 |
| 6,212,639 B1 | * | 4/2001 | Erickson et al. .............. 726/26 |
| 6,242,945 B1 | | 6/2001 | New |
| 6,259,271 B1 | * | 7/2001 | Couts-Martin et al. ....... 326/40 |
| 6,260,087 B1 | * | 7/2001 | Chang ........................ 710/100 |
| 6,337,579 B1 | * | 1/2002 | Mochida ...................... 326/41 |
| 6,441,641 B1 | * | 8/2002 | Pang et al. .................. 326/41 |
| 6,490,707 B1 | | 12/2002 | Baxter |

(Continued)

OTHER PUBLICATIONS

U.S. Appl. No. 10/654,518, filed Sep. 2, 2003, Tyson.

(Continued)

Primary Examiner—Rexford Barnie
Assistant Examiner—Dylan White
(74) Attorney, Agent, or Firm—Townsend and Townsend and Crew LLP

(57) ABSTRACT

Techniques for combining volatile and non-volatile programmable logic into one integrated circuit (IC) are provided. An IC is segregated into two portions. A first block of programmable logic is configured by bits stored in on-chip non-volatile memory. A second block of programmable logic is configured by bits stored in off-chip memory. The function of IO banks on the IC is multiplexed between the two logic blocks of the IC. The programmable logic in the first block can be configured and fully functional in a fraction of the time that the programmable logic in the second block can be configured. The programmable logic in the first block can configure fast enough and have enough independence to assist in the configuration of the second block. The non-volatile memory can also provide security features to a user design, such as encryption.

27 Claims, 5 Drawing Sheets

U.S. PATENT DOCUMENTS

| | | | |
|---|---|---|---|
| 6,515,509 B1 | 2/2003 | Baxter | |
| 6,526,563 B1 | 2/2003 | Baxter | |
| 6,538,468 B1 * | 3/2003 | Moore | 326/40 |
| 6,737,884 B2 * | 5/2004 | Shigemasa et al. | 326/38 |
| 6,766,406 B1 * | 7/2004 | Gasperini et al. | 710/315 |
| 6,842,034 B1 * | 1/2005 | Chan et al. | 326/8 |
| 6,918,027 B2 * | 7/2005 | Mantey et al. | 712/37 |
| 7,034,569 B1 * | 4/2006 | Balasubramanian et al. | 326/38 |
| 2004/0061147 A1 * | 4/2004 | Fujita et al. | 257/232 |
| 2005/0093572 A1 * | 5/2005 | Sun et al. | 326/38 |
| 2005/0102573 A1 * | 5/2005 | Sun et al. | 714/30 |
| 2005/0237083 A1 * | 10/2005 | Bakker et al. | 326/47 |

OTHER PUBLICATIONS

"Atlantic Interface," Altera Functional Specification 13, version 3.0, Altera Corporation San Jose, CA (Jun. 2002).

"FPGAs & FPSCs from Lattice: ORSPI4," product information from http://www.latticesemi.com, Lattice Semiconductor Corporation Hillsboro, OR (2003), no month.

"ORCA® ORSPI4 Dual SPI4 Interface and High Speed Serdes FPSC," product information Lattice Semiconductor Corporation Hillsboro, OR (2004), no month.

System Packet Interface Level 4 (SPI-4) Phase 2: OC-192 System Interface for Physical and Link Layer Devices, Optical Internetworking Forum Implementation Agreement : OIF-SPI4-02.0 (Jan. 2001).

Betz et al. *Architecture and CAD for Deep-Submicron FPGAs, 2nd printing* Kluwer Academic Publishers, chapters 2, 4, 5, and 7 (1999), no month.

* cited by examiner

TECHNIQUES FOR COMBINING VOLATILE AND NON-VOLATILE PROGRAMMABLE LOGIC ON AN INTEGRATED CIRCUIT

BACKGROUND OF THE INVENTION

The present invention provides techniques for combining volatile and non-volatile programmable logic on an integrated circuit (IC), and more particularly, to techniques for providing an IC that has one section of programmable logic configured by off-chip memory and another section of programmable logic configured by on-chip non-volatile memory.

Large field programmable gate arrays (FPGAs) that contain on-chip volatile memory blocks usually require a considerable amount of time to be configured at power-up, because configuration data is loaded onto the chip from an external memory chip. The external memory chip can be, for example, a serial read only memory (SROM).

Small complex programmable logic device (CPLDs) such as Altera's MAX family of CPLDs contain on-chip non-volatile memory. The configuration data is stored in the on-chip non-volatile memory. The configuration data can be loaded quickly from the on-chip non-volatile memory into the programmable logic at power-up. Non-volatile CPLDs are virtually instant-on at power-up and require no external configuration data. However, making a large FPGA have all non-volatile memory can be prohibitive in terms of area and can limit process selection.

Many large volatile FPGAs have a companion CPLD to orchestrate the power-up and configuration process. The CPLD can also encrypt the configuration data before it is transmitted to the FPGA to prevent the configuration data from being intercepted and copied. However, this technique is more complex, because it makes a large FPGA a three-device solution that includes the FPGA, a SROM, and a CPLD.

Therefore, it would be desirable to provide faster techniques for configuring field programmable gate arrays. It would also be desirable to provide users with ways to adequately secure their designs during the configuration process.

BRIEF SUMMARY OF THE INVENTION

The present invention provides techniques for combining volatile and non-volatile programmable logic into one integrated circuit (IC). An IC of the present invention is segregated into two portions. One portion of the IC contains a first block of programmable logic that is configured by bits stored in an on-chip non-volatile memory block. Another portion of the IC contains a second block of programmable logic that is configured by bits stored in an off-chip memory device.

The logic in the non-volatile portion of the IC can be configured and fully functional in a fraction of the time that the logic in the volatile portion can be configured. The logic in the non-volatile portion can configure fast enough and have enough independence to assist in the configuration of the volatile portion of the IC. The non-volatile memory can also provide security features to a user design, such as encryption and decryption.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
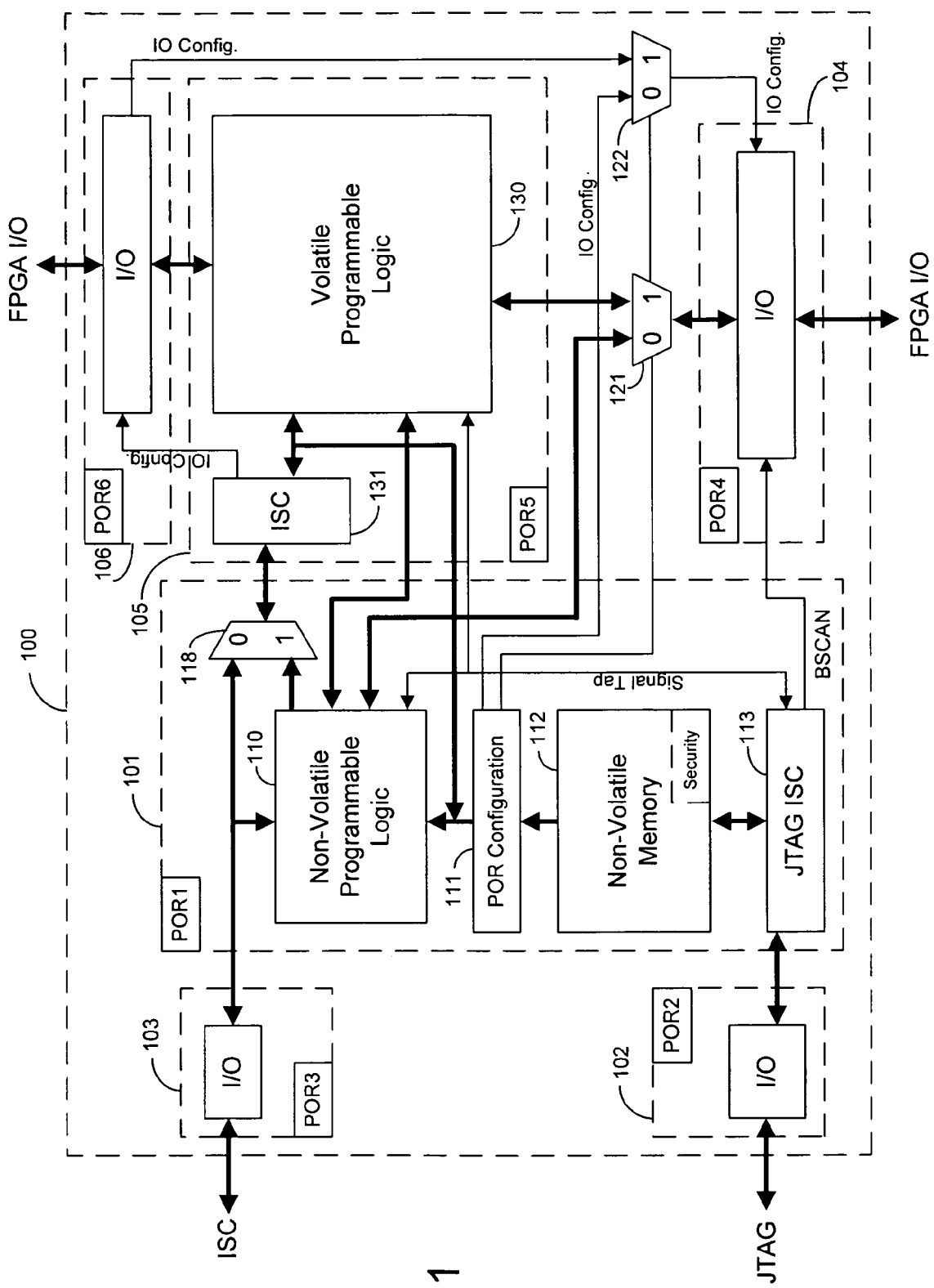
FIG. 1 illustrates an IC that contains a block of programmable logic configured by on-chip non-volatile memory and a block of programmable logic configured by off-chip memory, according to a first embodiment of the present invention.

FIG. 1 illustrates a portion 100 of a programmable logic integrated circuit (IC) that has been designed according to a first embodiment of the present invention. Portion 100 includes a first block 110 of programmable logic and a second block 130 of programmable logic. Both programmable logic blocks 110 and 130 contain programmable logic circuits. The programmable logic circuits can be, for example, lookup table based or product term based logic elements. The architecture of the programmable logic arrays in blocks 110 and 130 can be the same or different. Logic blocks 110 and 130 can also include memory. The memory in both of blocks 110 and 130 can be, for example, volatile memory such as SRAM cells.

The programmable logic in block 110 is configured by configuration bits stored in non-volatile memory block 112. Configuration bits can be stored in non-volatile memory block 112 by a manufacturer or by a user. Power on reset (POR) configuration block 111 transfers configuration bits from non-volatile memory 112 into memory within logic block 110.

The programmable logic in block 130 is configured by configuration bits stored in an external memory device. The external memory device can be, for example, a FLASH memory device or a serial ROM (SROM) memory device. The configuration bits can be loaded into block 130 from I/O port 103 through multiplexer 118 and in-system configuration (ISC) block 131.

As discussed above, many large FPGA's require considerable configuration time at power-up. On the other hand, small non-volatile CPLDs are virtually instant on at power up and require no external configuration data. However, it requires too much die area to place enough on-chip non-volatile memory on a large FPGA to configure all of the FPGA's programmable logic circuits.

The present invention solves these problems by providing two blocks of programmable logic (110 and 130). The programmable logic in block 110 can be configured quickly during power up by loading configuration data from memory 112. Block 110 preferably contains enough programmable logic to perform certain critical functions that need to be performed during the power up phase before block 130 is configured. Block 130 is configured more slowly by configuration data loaded from an external source.

According to one embodiment, most of the programmable logic on the IC resides in volatile block 130. In this embodiment, non-volatile memory block 112 only needs to be large enough to store configuration data for the programmable logic in block 110. Memory 112 can be relatively small in size, if block 110 is relatively small. This requirement minimizes the die area impact of memory 112 on the IC. Block 130 can, for example, perform all the FPGA functions subsequent to power-up.

Many more implementation possibilities are opened, if memory 112 is smaller in size. For example, a large non-volatile memory block used for an entire FPGA requires the most advanced EEPROM or FLASH process. A small memory block 12 that only supplies configuration data for a small fraction of an FPGA may use memory technologies such as polyfuse arrays and magnetic resistive ROM.

A specific example of functionality that programmable logic block 110 can perform is now discussed. System resets and critical signals need to be controlled before an FPGA is configured and fully functional. A large FPGA may play a central roll in its system. If the FPGA drives critical signals, resets, or buses, it will not be able to actively or correctly drive the signals until it is configured. Inactivity between power-up and configuration could prevent a system from properly powering up. To solve these problems, programmable logic block 110 can control critical signals during power-up.

Block 110 can also control configuration and sequence resets before and after the FPGA is configured. Block 110 has the ability to drive volatile FPGA block resets directly without the use of external IO signals.

As another example, block 110 can be used to secure the configuration data that is transmitted to block 130. Block 110 can be read protected like a CPLD, and can have an internal bypass to in-system configuration (ISC) port 131. Block 110 can perform additional data encryption/decryption that is not accessible to external pins.

For example, logic in block 110 can be configured upon power up to perform a decryption scheme based on an encryption algorithm stored in memory 112. Then, configuration data for block 130 is loaded into block 110 through I/O port 103 and decrypted. Subsequently, the decrypted configuration data is loaded from block 110 into block 130 (e.g., directly or through multiplexer 118).

Block 110 can personalize the encryption scheme for each customer to add to their security and comfort. Thus, a customer can chose any encryption scheme they want. If an encryption algorithm is cracked by a hacker, a customer can easily change the encryption scheme by loading a new algorithm into memory 112. Block 110 can also be used to encrypt or decrypt non-configuration data streams of the customer's choosing.

When the configuration data for an FPGA is not loaded from a dedicated SROM, it typically is loaded from a standard FLASH device or a processor bus. Either solution requires some logic that is active at power-up, before the FPGA is configured. This logic sequences and transfers data from a non-volatile data source to the FPGA configuration pins, (ISC Port). This logic benefits from implementation inside a FPGA, because it can accommodate a wide range of non-volatile storage devices including processors and a wide range of FPGA configuration modes.

Referring to FIG. 1, portion 100 of the IC includes six regions 101-106. Each of the six regions 101-106 includes a separate power on reset circuit (POR1-POR6). The power on reset circuits monitor power supply voltages from one or more power rails (or power grids). A power on reset circuit generates output signals that indicates when the power supply voltage from a corresponding power rail has reached a predefined level. The predefined supply voltage level indicates when a particular region of the IC can safely begin functioning. For example, power on reset circuit POR1 generates an output signal that indicates when the power supply voltage has increased to a minimum voltage level that is acceptable for the circuitry in region 101 to begin operating after power-up.

The regions of circuitry shown in FIG. 1 can be divided into two sections. The first section includes regions 101-104. Regions 101-104 are associated with non-volatile memory block 112 and programmable logic block 110. Regions 105-106 are associated with programmable logic block 130.

POR configuration block 111 controls and monitors the power on reset circuits POR1-POR6. As soon as power on reset circuits POR1-POR4 indicate that the power supply voltage has reached an acceptable level in regions 101-104, POR configuration block 111 transfers the configuration data stored in non-volatile memory 112 to non-volatile FPGA block 110.

Thus, POR1-POR4 allow the programmable logic in block 110 to be configured as soon as the power supply in regions 101-104 has reached a predefined level, without waiting for regions 105-106 to power up. This embodiment enables additional speed to the configuration of block 110 during power up.

Once power on reset circuits POR5 and POR6 indicate that the power supply has reached an acceptable level in regions 105-106, in-system configuration data can be loaded from an external source into block 130 through multiplexer 118 and ISC interface 131. POR configuration block 111 or programmable logic in block 110 can control the select input of multiplexer 118.

In the FPGA embodiment shown in FIG. 1, the in-system configuration (ISC) I/O port in region 103 interfaces with non-volatile programmable logic block 110 and volatile programmable logic block 130.

Alternatively, ISC data can be loaded into non-volatile block 110, and then subsequently loaded into block 130. The ISC configuration data can be loaded directly from block 110 to block 130 or through multiplexer 118 and ISC interface 131, as shown by the arrows in FIG. 1. Programmable logic in block 110 can encrypt ISC configuration data before it is loaded into block 130 to secure a customer's circuit design.

Non-volatile memory 112 does not lose its data pattern when power is removed. Memory 112 can be used, for example, to hold FPGA configuration files and volatile FPGA redundancy information. Memory 112 can be implemented in many ways. For example, memory 112 can be a metal fuse memory, which has one-time programmable memory cells. Other examples of memory 112 include a programmable anti-fuse array, a metal or poly mask programmable array, a flash memory array, an EEPROM memory array, a LASER programmed fuse array, a magnetic resistive memory array (MRAM), and a ferro-electric memory array (FeRAM). The smaller size of memory block 112 increases its density possibilities.

Non-volatile memory 112 can be programmed through the JTAG I/O test port in region 102 or the ISC port in region 103. The non-volatile programmable logic block 110 can also be programmed through the ISC I/O port in region 103, if the I/O port is not controlling block 110 already. Non-volatile block 110 could have access to a small subset of general purpose IOs, all of the ISC IOs, a subset of the internal reset and clock buses, and some general purpose internal routing interconnect lines.

Region 113 includes a Joint Test Action Group (JTAG) IO port and associated circuitry. Circuitry in region 113 decodes the JTAG commands that program non-volatile memory 112 according to well known techniques. Region 103 includes in-system configuration (ISC) IO port and associated circuitry that configures volatile FPGA block 130 at power-up. The ISC IO port can also used for reconfiguring volatile FPGA 130 configuration SRAM. In addition, the ISC IO port and circuitry in region 103 can be used to program non-volatile configuration SRAM in block 130 before a one-time-programmable non-volatile memory program is defined. It is important that a programming solution be available without any pre-condition on the configuration of block 110 or 112.

POR configuration block 111 also controls the IO in region 104 and the configuration and ISC source multiplexers 121 and 122. POR configuration block 111 can load configuration data from memory 112 into the I/O bank in region 104 through multiplexer 122 to configure the IO ports in region 104. Also, volatile ISC block 131 can reconfigure POR4 IO block 104, if POR configuration 111 allows it to.

POR configuration block 111 can give control of the I/O bank in region 104 to non-volatile FPGA 110. Once the programmable logic in block 110 have been configured, the programmable logic determines the control of multiplexer 121. Multiplexer 121 routes signals between I/O ports in region 104 and non-volatile block 110 or volatile block 130. Thus, input and output signals can be routed through I/O ports in region 104 to programmable logic in blocks 110 or 130 by controlling multiplexer 121.

Figure 2:
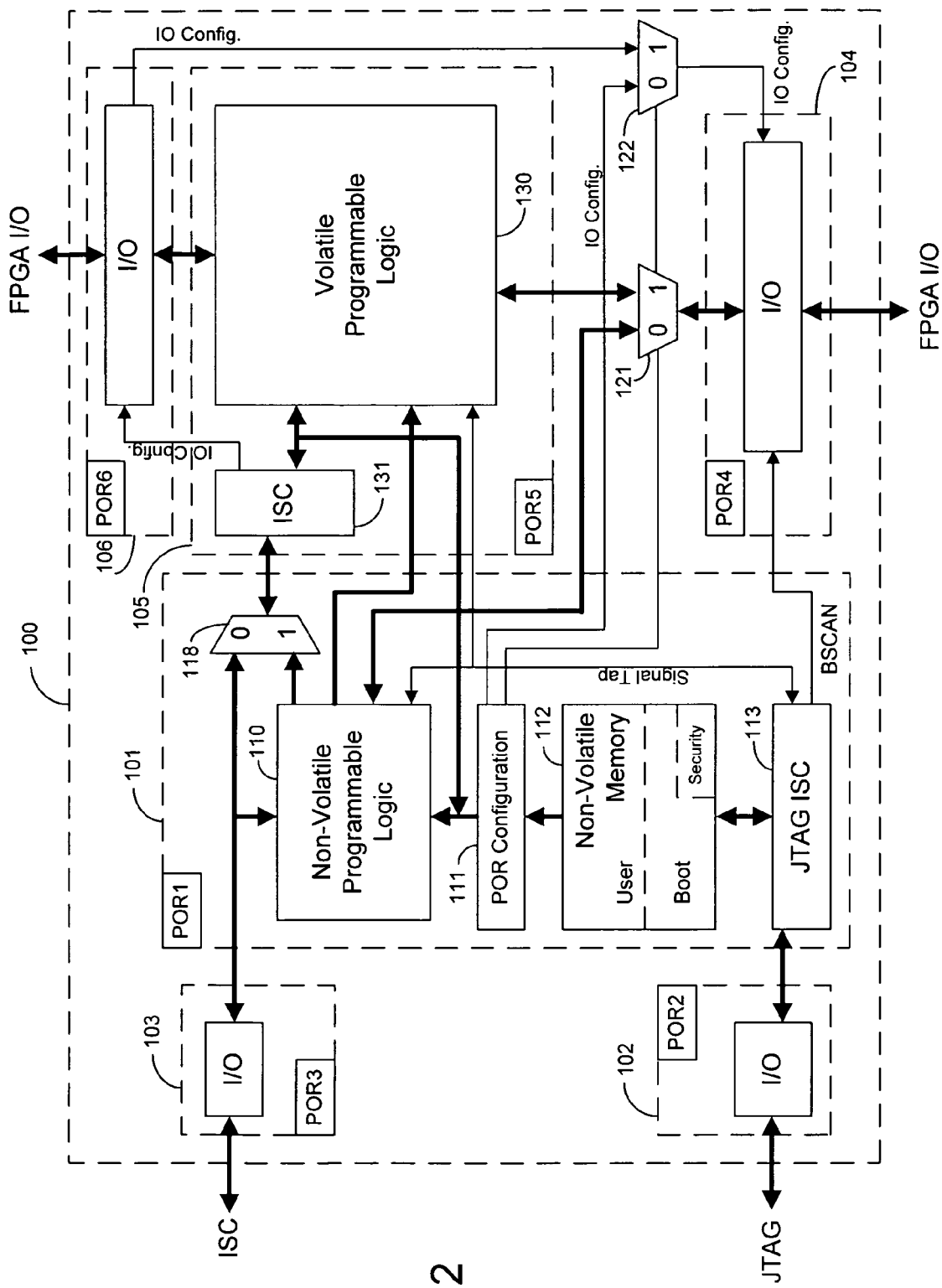
FIG. 2 illustrates the IC shown in FIG. 1 with an on-chip non-volatile memory block that is large enough to store user and manufacturer configuration data, according to a second embodiment of the present invention.

FIG. 2 illustrates a second embodiment of the present invention. According to this embodiment, two sets of configuration data can be stored in memory block 112. The first set of configuration data is a boot pattern that is programmed by the manufacturer to give the FPGA standard functionality for every customer, such as an ASSP. This embodiment has the advantage of allowed a FPGA manufacturer to change the product definition over time by a simple change to out manufacturing test flow.

Once a user has defined an application, the user can write additional configuration data into memory 112. For example, a user can store configuration data in memory 112 that is used to operate the FPGA in a diagnostic mode to test various signals.

In an OTP type non-volatile memory, two partitions are need in memory block 112. One partition is used to store the manufacturer's default boot configuration data, and one partition is used to store user configuration data to better meet a user's specific needs. The partitions are shown for memory block 112 in FIG. 2. The configuration logic can skip the boot configuration if it detects valid data in the user partition.

In the embodiment of FIG. 2, non-volatile memory 112 has enough memory so that it can store the two sets of configuration data for block 110. According to further embodiments of the present invention, non-volatile memory 112 can store more than 2 sets of configuration data for block 110. Memory 112 in FIG. 2 can store N times as much data as memory 112 in FIG. 1, where N is the number of configuration data sets needed to configure block 110.

Figure 3A:
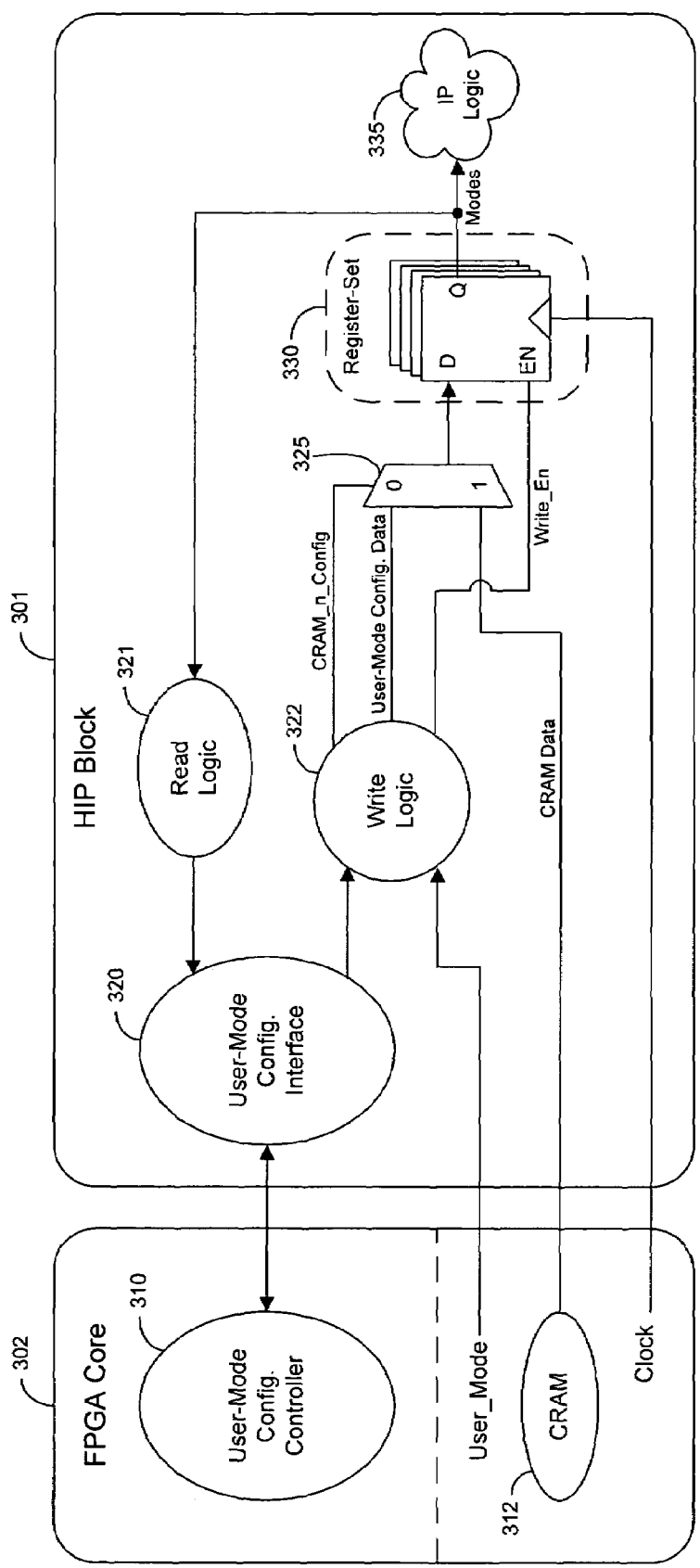
FIG. 3A illustrates a hard intellectual property (HIP) block on a programmable logic IC having a programmable register set that provides programmability to the HIP block, according to a third embodiment of the present invention.

FIG. 3A illustrates another embodiment of the present invention. Many of today's programmable logic integrated circuits have hard intellectual property (HIP) blocks. An HIP block is a segment of application-specific circuitry (ASIC) that is hardwired to perform predefined functions. Manufacturers add HIP blocks to programmable logic ICs when a large number of customers require the same functionality. ASICs are typically more efficient than FPGAs at performing specific functions. However, ASICs are far less flexible than FPGAs, because they can only perform the functions hardwired by the mask set.

Often FPGA customers have similar, but not identical, requirements for particular types of circuit functions. In these instances, it is desirable to provide an HIP block on an FPGA that some built in programmability. The embodiment shown in FIG. 3A provides built in programmability in an HIP block in the form of a programmable register set, which is described in detail below. The programmable register set increases the flexibility of a HIP block.

FIG. 3A illustrates a block diagram of a CRAM-initialized register-set in an HIP block 301 on a programmable logic IC. The block diagram of FIG. 3A shows a configuration interface 320 that can be re-configured during user-mode, configuration RAM (CRAM) 312 for FPGA configuration initialization, and a programmable register-set 330 that outputs the mode settings into IP logic 335.

IP logic 335 contains logic circuitry in HIP block 301 that has been hardwired to perform specific functions. Programmable register set 335 provides some programmability to the functions performed by IP logic 335. For example, register set 330 can control multiplexers or counters in IP logic 335 to provide multiple options in terms of the functionality of the logic.

Programmable register-set 330 can be programmed during the user-mode of the FPGA and can have a fixed function upon power-up. Register set 330 can be programmed by user mode configuration data from the User_Mode signal, bits stored in CRAM 312, or from user-mode configuration interface 320. Write logic 322 transmits the user mode configuration data to register set 330 through multiplexer 325. Configuration data from CRAM 312 can also be transferred to register set 330 directly through multiplexer 325.

Upon power up, the Write-Logic 322 is defaulted to cause multiplexer 325 to select CRAM interface 312 by setting CRAM_n_Config to '1' and Write_En to '1'. The programmable IC CRAM bits are loaded during the FPGA configuration cycle. Upon entering user-mode, the programmable IC core asserts the User_Mode signal, and the clock signals start to toggle. A synchronous self-timing circuit based on the User_Mode signal assertion can be implemented within Write-Logic 322 to guarantee the CRAM value is sampled into the register-set 330 as the default setting.

Write-Logic 322 can switch multiplexer 325 to select user-mode configuration interface 320 by setting CRAM_n-_Config to '0'. During the user-mode, the output value of register-set 330 can be altered by write cycles (of the bus protocol scheme) by loading data from user-mode configuration controller 310 through user-mode configuration interface 320 into register set 330. User-mode configuration controller 310 is typically implemented as programmable logic blocks configured according to a configuration data set. Register set 330 is typically implemented as memory-mapped registers.

The register-set 330 output value can be read back through read logic 321 and configuration interface 320 for monitoring, debugging and testing purposes. For testing purposes, user-mode configuration interface 320 allows settings stored in register set 330 to be read back to verify that the settings are correct. By using the configuration interface of this embodiment, the connectivity from CRAM 312 into HIP block 301 can be verified for better test coverage.

Register-set 330 is preferably not asynchronously initialized by CRAM. Such an implementation would be sensitive to a race condition, if register-set 330 supports both asynchronous set and asynchronous reset. To avoid the race condition, extra logic can be added. However, the overall cost of adding such logic would be more expensive compared to the synchronous initialization scheme described above.

There are several advantages to the embodiment of FIG. 3A. For example, this embodiment provides better test coverage for connectivity from CRAM to register-set. Test time is also reduced due to the structural nature of the testing compared to the traditional IP functional testing scheme in which correct CRAM settings can only be verified by running IP functional test vectors. However, from a die area cost perspective, this embodiment may not be suitable for a very large register-set.

Figure 3B:
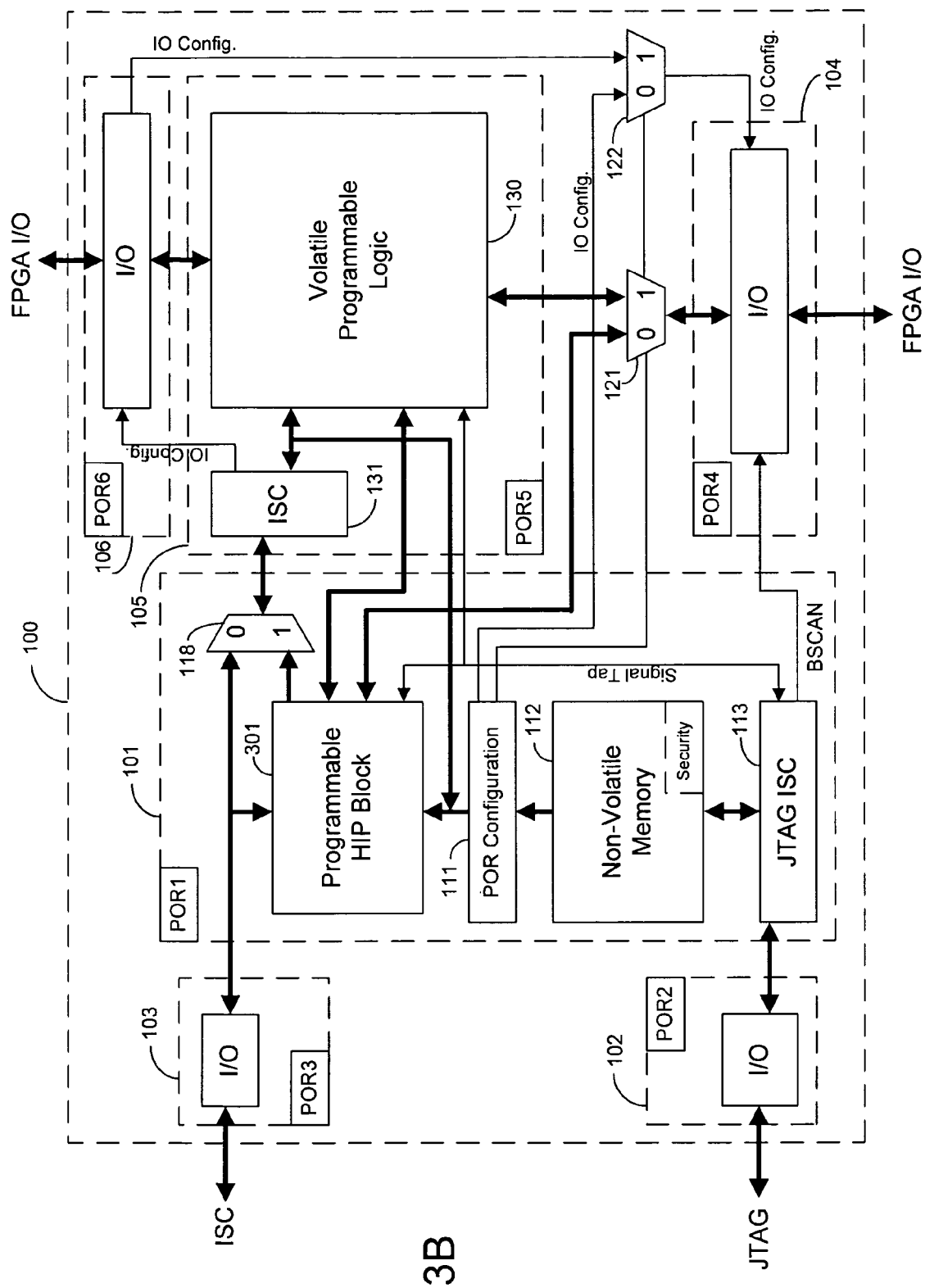
FIG. 3B illustrates an IC that contains the programmable HIP block of FIG. 3A and a block of programmable logic configured by off-chip memory, according to a fourth embodiment of the present invention.

According to another embodiment of the present invention, programmable HIP block 301 can replace programmable logic block 110 in FIG. 1 or FIG. 2. FIG. 3B illustrates this embodiment. FIG. 3B allows HIP block 301 to work independently of volatile programmable logic block 130.

FIG. 3B also maximizes the ability of HIP block 301 to be instant-on with only a small amount of programming. Because HIP block 301 in FIG. 3B only requires a small amount of configuration data to be stored in memory 112, memory block 112 can be implemented using many types of memory (e.g., polyfuse, magnetic resistive ROM, etc.).

The embodiment of FIG. 3B illustrates that the architecture of programmable logic blocks 301 and 130 do not need to be identical. The architectures of blocks 301 and 130 only need to have some level of programmability. It is also desirable (but not necessary) that block 301 require significantly less configuration bits than block 130. It is typically not necessary that the area or complexity of block 301 be less.

Figure 4:
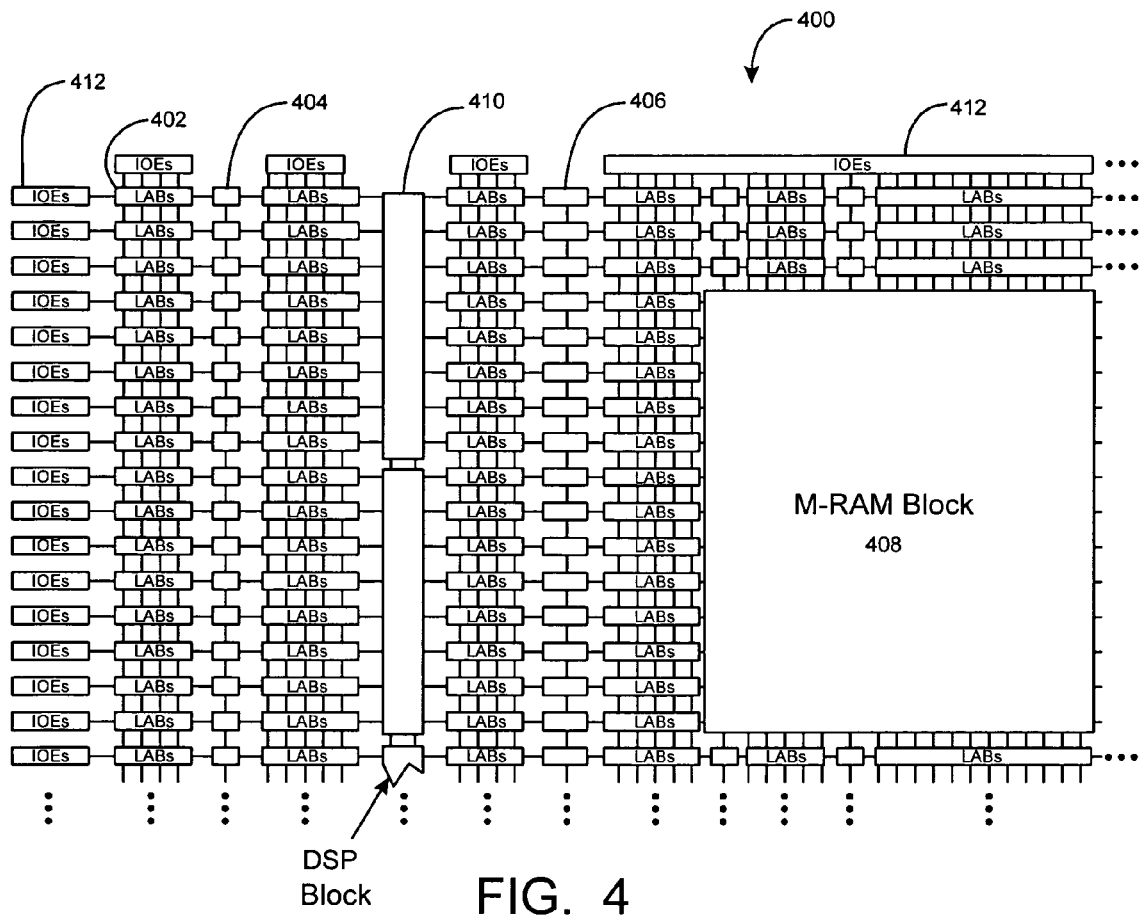
FIG. 4 is a simplified block diagram of a programmable logic device that can be used with the techniques of the present invention.

FIG. 4 is a simplified partial block diagram of one example of PLD 400 that can include aspects of the present invention. Although the present invention is discussed primarily in the context of PLDs and FPGAs, it should be understood that the present invention can be applied to numerous types of programmable integrated circuits. PLD 400 is an example of a programmable integrated circuit in which techniques of the present invention can be implemented. PLD 400 includes a two-dimensional array of programmable logic array blocks (or LABs) 402 that are interconnected by a network of column and row interconnects of varying length and speed. LABs 402 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 400 also includes a distributed memory structure including RAM blocks of varying sizes provided throughout the array. The RAM blocks include, for example, 512 bit blocks 404, 4K blocks 406 and a Block 408 providing 512K bits of RAM. These memory blocks can also include shift registers and FIFO buffers.

PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
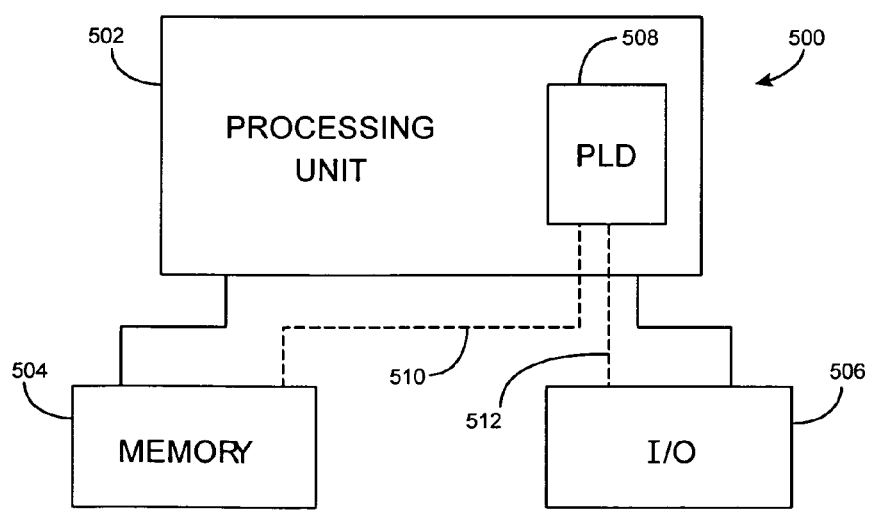
FIG. 5 is a block diagram of an electronic system that can implement embodiments of the present invention.

While PLDs of the type shown in FIG. 4 provide many of the resources required to implement system level solutions, the present invention can also benefit systems wherein a PLD is one of several components. FIG. 5 shows a block diagram of an exemplary digital system 500, within which the present invention can be embodied. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 508 is embedded in processing unit 502. PLD 508 can serve many different purposes within the system in FIG. 5. PLD 508 can, for example, be a logical building block of processing unit 502, supporting its internal and external operations. PLD 508 is programmed to implement the logical functions necessary to carry on its particular role in system operation. PLD 508 can be specially coupled to memory 504 through connection 510 and to I/O unit 506 through connection 512.

Processing unit 502 can direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 508 can control the logical operations of the system. In an embodiment, PLD 508 acts as a reconfigurable processor, which can be reprogrammed as needed to handle a particular computing task. Alternately, programmable logic device 508 can itself include an embedded microprocessor. Memory unit 504 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A integrated circuit comprising:
a non-volatile memory block;
a first block of programmable logic that is configured by configuration data stored in the non-volatile memory block;
an in-system configuration interface; and
a second block of programmable logic that is configured by external configuration data loaded into the second programmable logic block through the in-system configuration interface, wherein the first block is operable to assist in the configuration of the second block.

2. The integrated circuit defined in claim 1 wherein the second block of programmable logic is programmed by transferring configuration data through the first block of programmable logic.

3. The integrated circuit defined in claim 1 further comprising:
a first power on reset circuit; and
a power on reset configuration block coupled to the first power on reset circuit, the non-volatile memory block, and the first block of programmable logic,
wherein the power on reset configuration block transfers configuration data from the non-volatile memory block to the first block of programmable logic when the first power on reset circuit indicates that a power supply voltage has reached a predetermined level.

4. The integrated circuit defined in claim 3 further comprising:
a second power on reset circuit coupled to the power on reset configuration block,
wherein the power on reset configuration block transfers configuration data from an external memory to the second block of programmable logic when the second power on reset circuit indicates that a power supply voltage has reached a predetermined level.

5. The integrated circuit defined in claim 4 further comprising:
an additional power on reset circuit residing in the same portion of the integrated circuit as the first or the second power on reset circuits.

6. The integrated circuit defined in claim 1 further comprising:
a first I/O block;
a first multiplexer having a first input terminal coupled to the first I/O block, a second input terminal coupled to the first block of programmable logic, an output terminal coupled to the in-system configuration interface, and a select input coupled to the first block of programmable logic.

7. The integrated circuit defined in claim 6 further comprising:
a second I/O block; and
a JTAG interface coupled to the second I/O block and the non-volatile memory block.

8. The integrated circuit defined in claim 7 further comprising:
a third I/O block; and
second multiplexer coupled to the third I/O block, the first block of programmable logic, and the second block of programmable logic.

9. The integrated circuit defined in claim 8 further comprising:
a fourth I/O block coupled to the second block of programmable logic.

10. The integrated circuit defined in claim 1 wherein the first block of programmable logic and the second block of programmable logic both contain blocks of SRAM programmable logic cells.

11. The integrated circuit defined in claim 1 wherein the first block of programmable logic contains a partially programmable hard intellectual property block and the second block of programmable logic contains blocks of SRAM programmable logic cells.

12. The integrated circuit defined in claim 1 wherein an encryption algorithm for the first programmable logic block is stored in the non-volatile memory block.

13. The integrated circuit defined in claim 1 wherein a boot pattern is stored in a first portion of the non-volatile memory block and user data is stored in a second portion of the non-volatile memory block.

14. A method for fabricating an integrated circuit (IC), the method comprising:
providing a non-volatile memory block on the IC;
providing a first block of programmable logic on the IC designed to be configured by configuration data stored in the non-volatile memory block;
providing an in-system configuration interface on the IC; and
providing a second block of programmable logic on the IC designed to be configured by configuration data loaded into the second programmable logic block through the in-system configuration interface, wherein the first block is operable to assist in the configuration of the second block.

15. The method defined in claim 14 further comprising:
providing a first power on reset circuit on the IC; and
providing a power on reset configuration block on the IC that is designed to transfer configuration data from the non-volatile memory block to the first block of programmable logic when the first power on reset circuit indicates that a power supply voltage has reached a predetermined level.

16. The method defined in claim 15 further comprising:
providing a second power on reset circuit on the IC, wherein the power on reset configuration block is designed to transfer configuration data from an external memory to the second block of programmable logic when the second power on reset circuit indicates that a power supply voltage has reached a predetermined level.

17. The method defined in claim 14 wherein the first block of programmable logic and the second block of programmable logic both contain blocks of SRAM programmable logic cells.

18. The method defined in claim 14 wherein the first block of programmable logic contains a partially programmable hard intellectual property block, and the second block of programmable logic contains blocks of SRAM programmable logic cells.

19. The method defined in claim 14 further comprising:
storing a boot pattern in a first portion of the non-volatile memory block, wherein a second portion of the non-volatile memory block is available to store user data.

20. The method defined in claim 14 further comprising:
storing an encryption algorithm in the non-volatile memory block, the encryption algorithm being used to encrypt the external configuration data.

21. An integrated circuit (IC) comprising:
an in-system configuration interface;
means for configuring first programmable logic circuits by external configuration data that is loaded into the IC through the in-system configuration interface;
a non-volatile storage block; and
means for configuring second programmable logic circuits by internal configuration data stored in the non-volatile storage block, wherein the first block is operable to assist in the configuration of the second block.

22. The integrated circuit according to claim 21 wherein the means for configuring the first programmable logic circuits and the means for configuring the second programmable logic circuits both comprise SRAM cells.

23. The integrated circuit according to claim 21 wherein the means for configuring the first programmable logic circuits comprises SRAM cells, and the means for configuring the second programmable logic circuits comprises a partially programmable hard intellectual property block and a register set.

24. The integrated circuit according to claim 21 wherein the non-volatile storage block includes a first portion for storing boot data and a second portion for storing user data.

25. The integrated circuit according to claim 21 wherein the non-volatile storage block stores an encryption algorithm for encrypting the external configuration data.

26. An integrated circuit comprising:
blocks of programmable logic; and
a partially programmable hard intellectual property (HIP) block that includes a programmable register set and application specific circuits, wherein the programmable register set is configured to control functions of a subset of the application specific circuits, wherein logic circuitry in the partially programmable HIP block loads configuration data into the programmable register set from CRAM during power up of the integrated circuit.

27. The integrated circuit defined in claim 26 wherein logic circuitry in the partially programmable HIP block loads data into the programmable register set from a user mode configuration controller through a configuration interface.

* * * * *